United States Patent [19]

Okazaki

[11] Patent Number: 4,633,520

[45] Date of Patent: Dec. 30, 1986

[54] PRESCALER INPUT CIRCUIT

[75] Inventor: Mitsunari Okazaki, Soma, Japan

[73] Assignee: Alps Electric Co., Ltd., Japan

[21] Appl. No.: 569,672

[22] Filed: Jan. 10, 1984

[30] Foreign Application Priority Data

Jan. 11, 1983 [JP] Japan ................. 58-2021[U]

[51] Int. Cl.[4] ............................................. H04B 1/26
[52] U.S. Cl. ................................. 455/319; 455/317;
455/325; 455/327; 331/77; 307/520
[58] Field of Search ............... 307/520, 529; 331/77,
331/96, 101, 325; 455/317, 318, 319, 327

[56] References Cited

U.S. PATENT DOCUMENTS

| | | | |
|---|---|---|---|
| 3,416,086 | 12/1968 | Carlson | 455/319 |
| 3,560,886 | 2/1971 | Cooper et al. | 455/327 |
| 3,716,730 | 2/1973 | Lerny | 307/529 |
| 4,061,990 | 12/1977 | Ueno | 455/325 |
| 4,352,210 | 9/1982 | Puckette | 455/317 |
| 4,355,420 | 10/1982 | Ishihara | 455/317 |
| 4,403,156 | 9/1983 | Sakamoto | 307/529 |

Primary Examiner—John S. Heyman
Attorney, Agent, or Firm—Guy W. Shoup

[57] ABSTRACT

A prescaler input circuit for a frequency converter unit uses a strip line type of directional coupler to isolate the prescaler unit from the frequency converter unit, eliminate beat interference and erroneous frequency dividing operation, and provide a simple and economical structure. The coupler has the prescaler input line inductively coupled to a local oscillator injection element and grounded through a resistor. An earth line is arranged in proximity to the injection lead to provide impedance matching for the coupler.

7 Claims, 10 Drawing Figures

4,633,520

PRESCALER INPUT CIRCUIT

FIELD OF THE INVENTION

This invention relates to an input circuit of prescaler, more specifically to an input circuit of prescaler which is simplified, cheap and assures stable operation of a prescaler circuit, for example, to be used for frequency convertor of a superheterodyne receiver.

BACKGROUND OF THE INVENTION

FIG. 1 is an example of connection between the frequency convertor and prescaler of an existing superheterodyne receiver. FIG. 2 is a detail circuit of a part of the frequency convertor and prescaler of FIG. 1.

In these figures, 1 is a local oscillator, 2 is a buffer amplifier; 3 is a receiving signal input terminal; 4 is an input signal filter; 5 is a mixer; 6 is an intermediate signal output terminal; 7 is a prescaler; 8 is a divided frequency output terminal; 9 is an injection capacitor; 10 is a local oscillation signal injection circuit; 11 and 12 are voltage dividing resistors; 13 and 14 are coupling capacitors; 15 is a trap coil; 16 is a trap capacitor; 17 is a prescaler integrated circuit (IC).

A local oscillation signal generated by the local oscillator 1 is amplified by the buffer amplifier 2 and then sent to the mixer 5. Meanwhile, a receiving signal applied to the receiving signal input terminal 3 passes the input signal filter 4 and is then applied to the mixer 5. It is mixed therein with a local oscillation signal and is converted to an intermediate frequency and then extracted from the intermediate frequency signal output terminal 6. In addition, the local oscillation signal is partly divided by the prescaler 7 and is then extracted from the divided frequency output terminal 8.

Explanation will then be continued further in accordance with the detail circuit diagram of FIG. 2. An output of the buffer amplifier 2 is guided to the mixer 5 by the local oscillation signal injection circuit 10 and injection capacitor 9 and is then applied to the prescaler IC 17 from the local oscillation signal injection circuit 10, partly branching the local oscillation signal through the voltage dividing resistors 11, 12, coupling capacitors 13, 14, trap coil 15, trap capacitor 16. Thereby, a frequency divided output of said local oscillation signal can be extracted from the divided frequency output terminal 8.

Here, a voltage dividing resistor and trap circuit operate as follows. The prescaler IC 17 is ordinarily composed of the flip-flop circuit and the frequency dividing ratio is determined by the number of stages. Accordingly, the flip-flop circuits of many stages are required in order to obtain a large dividing ratio. The waveform of the frequency-divided signal is almost rectangular including many harmonics. Of those harmonics, the 3rd harmonic is most intensive. Namely, in the process that the frequency is divided into ½, ¼, ⅛, ... by the flip-flop circuits, the frequency components 3/2, 3/4, 3/8, ... are generated and these harmonics are also applied to the mixer 5 passing the local oscillation signal injection circuit 10 from the input circuit of the prescaler. As a result, unwanted beat interference occurs.

The trap circuit shown in FIG. 2 is inserted for attenuating harmonics of the frequency divided by the prescaler and the voltage dividing resistors 11, 12 sets the local oscillation signal level to the prescaler IC 17 to the optimum condition and attenuates the interference signal sent from the prescaler IC 17.

According to an existing example, as explained above, many trap circuits being suitable for the frequencies of respective signals are required in order to perfectly attenuate many interference signals. But it is very uneconomical. Moreover, there is such a disadvantage that since the trap circuit attenuates not only the interference signal generated by the prescaler IC 17 but also an input signal in the same way if it has the same frequency as said interference signal, such an input signal to the prescaler IC 17 is also attenuated in the vicinity of the trap frequency when the local oscillation signal which can be varied in broad band is divided, resulting in erroneous frequency dividing operation. Further, aforementioned prior art is followed by a problem that it is very difficult to adjust an input level to the optimum level.

SUMMARY OF THE INVENTION

This invention is intended to solve the problems explained above of the prior arts. It is therefore the first object of this invention to provide a prescaler circuit which assures less beat interference. It is the second object to provide a prescaler circuit which does not generate erroneous frequency dividing operation. It is the third object to provide an economical prescaler circuit with simplified structure. For these objects, an input circuit of the prescaler of this invention considers application of a strip line type directional coupler.

DETAILED DESCRIPTION OF THE INVENTION

Figure 1:
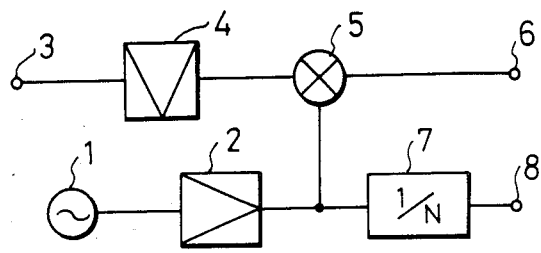
FIG. 1 is an example of connection between the frequency convertor and prescaler of an existing superheterodyne receiver.
Figure 2:
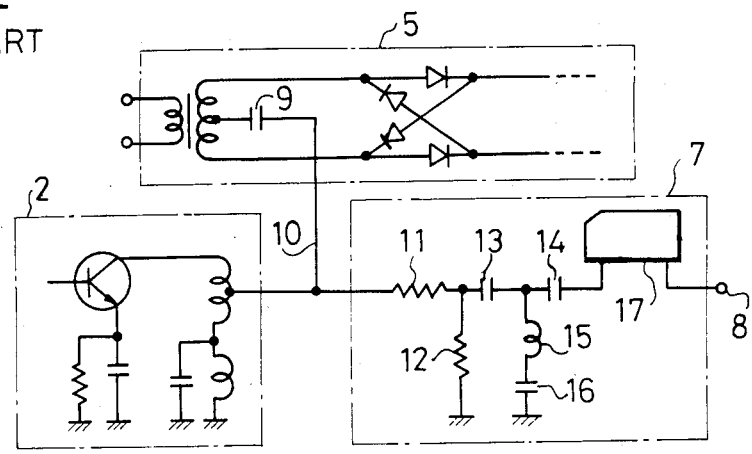
FIG. 2 is a detail circuit of a part of the frequency convertor and prescaler shown in FIG. 1.
Figure 3:
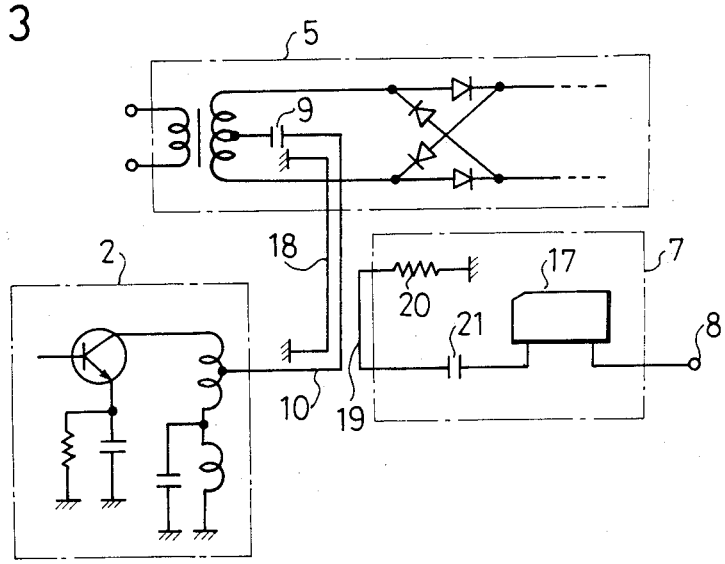
FIG. 3 is the structure of an embodiment of this invention.

FIG. 3 is the structure of an embodiment of this invention. In this figure, 2, 5, 7, 8, 10 correspond to FIG. 2; 18 is an earth ground line; 19 is a coupling loop; 20 is a termination resistor; 21 is a coupling capacitor.

The local oscillation signal injection circuit 10 is provided with the parallel earth line 18. Moreover, said local oscillation signal injection circuit 10 is also provided with a coupling loop 19 which combines with static capacitance and mutual inductance with the earth side of said coupling loop 19 being earthed by a termination resistor 20, while the other end of said coupling loop 19 being connected to the input of prescaler IC 17 through the coupling capacitor 21.

Therefore, a local oscillation signal amplified by the buffer amplifier 2 is transmitted to the mixer 5 through the local oscillation signal injection circuit 10 and simultaneously the local oscillation signal is partly extracted and then supplied to the prescaler IC 17. However, a part of the signal reflected at the input end of the mixer 5 is consumed by the termination resistor 20 and is eliminated from the input to the prescaler IC 17. Various unwanted signals generated by the prescaler IC 17 are eliminated from the mixer 5 through the coupling loop 19 and is lost through the termination resistor 20. Moreover, an input level of the prescaler IC 17 is easily preset to the optimum level by adjusting a degree of coupling of the coupling loop 19 (for example, distance between the local oscillation signal injection circuit 10 and coupling loop).

In principle, the circuit structure explained above may be thought of as an application of the strip line type directional coupler. The local oscillation signal is input to the mixer 5 and prescaler IC 17 and does not appear on the termination resistor 20. The reflected wave from the mixer 5 is input to the termination resistor 20 and buffer amplifier 2 but not to the prescaler. The harmonics sent from the prescaler IC 17 are sent to the termination resistor 20 and buffer amplifier 2 but not to the mixer 5. Therefore, the mixer 5 and prescaler IC 17 are sufficiently isolated, thereby eliminating influence of harmonics.

In addition, the earth line 18 matches the line impedance of lead wires by adjusting unwanted inductance and unwanted capacitance which the injection capacitor 9 has and attenuates the standing wave generated on the lead wire and reflected power. Accordingly, it is possible to efficiently inject the local oscillation signal including less interference to the prescaler with flat frequency characteristic of a voltage to be injected to the mixer 5.

FIG. 4 through FIG. 10 is a practical structure of the earth line 18. In this figure, 9 is an injection capacitor; 23 is an insulation tube; 24 is a conductive pipe; 25 is a conductive U-groove; 26 is an earth rod; 27 is a conductive frame; 28 is a connecting pattern; 29 is an earth pattern; 30 is a subtrate; 31 is a connecting lead wire; 32 is a conductive shield plate.

Figure 4:
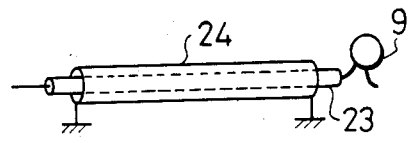
FIG. 4 through FIG. 10 are structures of the earth line shown in FIG. 3.
Figure 5:
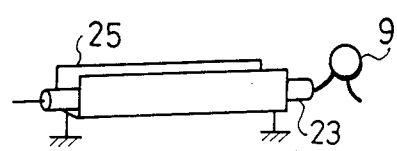
Figure 6:
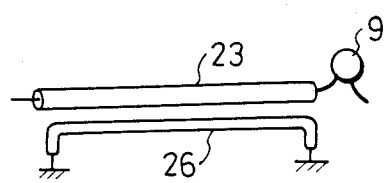
Figure 7:
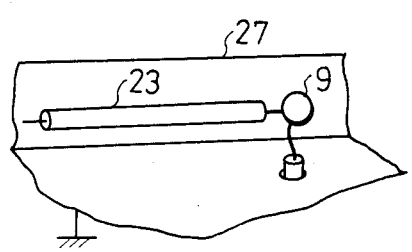

FIG. 4 is an example of using the conductive pipe 24 as the earth line. The lead wire of injection capacitor 9 is covered with the insulation tube 23 and is then extended wthin the conductive pipe 24. Thereby, impedance matching is carried out. FIG. 5 is an example of using the conductive U-groove 25 as the earth line 18. FIG. 6 is an example of using the earth rod 26 as the earth line 18. FIG. 7 is an example of using the conductive frame as the earth line 18.

Figure 8:
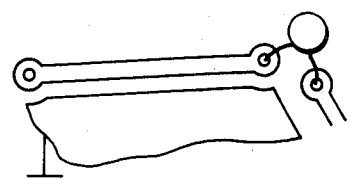

FIG. 8 is an example where the lead wire of injection capacitor 9 and the earth line are realized on the printed circuit board as the connecting pattern 28 and earth pattern 29. Impedance matching is realized by disposing the earth pattern 29 in the vicinity of connecting pattern 28.

Figure 9:
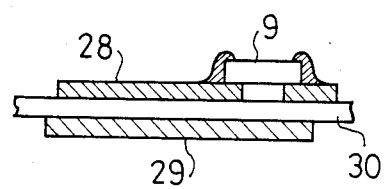
Figure 10:
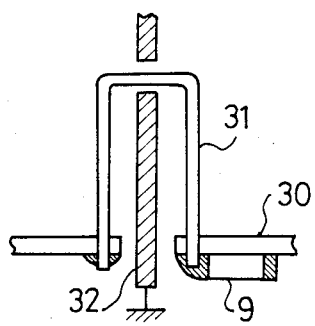

FIG. 9 is a cross-sectional view of the example where a chip capacitor is used as the injection capacitor 9 and the strip line of the connecting pattern 28 and the earth pattern 29 on the substrate 30 is used. FIG. 10 is a crosssectional view of an example where the conductive shield plate 32 existing between the buffer amplifier and mixer and the connecting lead wire 31 are used.

As explained above, according to this invention, it is possible to provide an input circuit of the prescaler which has the advantage that not only the structure is very simplified and economical as compared with the existing one but also resistive to interference due to no coupling in principle between the prescaler and mixer, because a signal is extracted by utilizing the coupling loop and termination resistor. Particularly, an outstanding advantage in performance can be obtained by isolating, from the point of view of high frequency, the frequency convertor of the superheterodyne which forms the linear circuit and is sensible to interference signal and the prescaler which forms the digital circuit and generates many harmonics.

Moreover, in this invention, the reflected wave from the mixer is not guided to the prescaler IC 17 and accordingly the input level to the prescaler IC is very stabilized with less fluctuation of frequency. In addition, the input level to the prescaler IC can be adjusted easily. From this point of view, this invention can be widely applied to a CATV convertor, TV tuner, FM tuner and others.

What is claimed is:

1. An improved prescaler input circuit for a frequency converter unit of the type having a local oscillator circuit providing a local oscillation frequency signal to a mixer through an injection lead and a prescaler unit providing a frequency divided output signal from the local oscillation frequency signal,
   wherein the improvement comprises a coupling loop for inductively coupling the injection lead carrying the local oscillation frequency signal to the prescaler unit, said coupling loop including an input line having one end connected to the prescaler unit and the other end grounded through a resistor, and an earth line in proximity to said injection lead for providing impedance matching for said injection lead, thereby preventing mutual interference between said mixer and said prescalar.

2. An improved prescaler input circuit as described in claim 1, wherein the earth line is a wire disposed in parallel with the injection lead.

3. An improved prescaler input circuit as described in claim 1, wherein the earth line is a grounded conductive pipe having the injection lead passing through the inside thereof.

4. An improved prescaler input circuit as described in claim 1, wherein the earth line is a U-shaped element with the injection lead positioned therein.

5. An improved prescaler input circuit as described in claim 1, wherein the earth line is formed as part of a conductive frame for the frequency converter unit.

6. An improved prescaler input circuit as described in claim 1, wherein the earth line is a grounded pattern on a printed circuit board and the injection lead is an adjacent pattern thereon.

7. An improved prescaler input circuit as described in claim 6, wherein the injection lead is connected to an injection element connected to the mixer consisting of a chip capacitor mounted on the printed circuit board.

* * * * *